United States Patent [19]

Wehner

[11] Patent Number: 4,836,326

[45] Date of Patent: Jun. 6, 1989

[54] OPTIMAL SHADOW OMNIPHONIC MICROPHONE AND LOUDSPEAKER SYSTEM

[76] Inventor: Raymond Wehner, 241 Eveline Street, Selkirk, Manitoba, Canada, R1A 1L7

[21] Appl. No.: 73,146

[22] Filed: Jul. 14, 1987

[30] Foreign Application Priority Data

Jul. 23, 1986 [GB] United Kingdom ................ 8617953

[51] Int. Cl.$^4$ ................................................ H05K 5/00

[52] U.S. Cl. .................................... 181/144; 181/145; 181/147; 181/148; 181/153; 181/199; 381/91; 381/155; 381/169

[58] Field of Search ............... 181/144, 145, 147, 148, 181/153, 175, 199; 381/91, 154, 155, 163, 169

[56] References Cited

U.S. PATENT DOCUMENTS 4,122,910 10/1978 Wehner .............................. 181/144

*Primary Examiner*—B. R. Fuller

*Attorney, Agent, or Firm*—Murray E. Thrift; Stanley G. Ade; Adrian D. Battison

[57] ABSTRACT

The invention comprises a microphone and loud speaker system in which the components include a cylinder having a center section and an end section at each end of the center section in axial alignment with one another. The adjacent ends of the center and end sections are elliptical and lie in planes oriented at an angle of 35°16′ to the longitudinal axis of the module, the long axes of the ellipses are oriented at 45° to horizontal. The planes of the elliptical ends are substantially isomorphic to the tympanic membrane of the human hearing structure and represent half the dihedral angle of a regular tetrahedron. All of the loudspeaker transducers are shielded by sheilding cylinders with elliptical end faces lying in planes oriented, at half the dihedral angle of a regular tetrahedron, namely, 35°16′ to the axes of the cylinders, with the long axes of the ellipses oriented at 45° to the horizontal.

14 Claims, 2 Drawing Sheets

OPTIMAL SHADOW OMNIPHONIC MICROPHONE AND LOUDSPEAKER SYSTEM

BACKGROUND OF THE INVENTION

This invention relates to new and useful improvements to omniphonic microphone and loud speaker systems illustrated and described in my U.S. Pat. No. 4,122,910 which is hereby incorporated by reference.

In this U.S. Patent, a regular tetrahedron construction is used for both the microphone and loud speaker components. However, that particular construction contains some directional ambiguity, which ambiguity is significantly reduced by the improvements described hereafter.

A superficial inspection of the enclosed description appears to indicate that the regular tetrahedral basis for the original invention shown in the U.S. Patent, has disappeared.

However, as will become apparent, a plane passing through the cylindrical truncations of either the microphone or the loud speaker components once again generates the regular tetrahedral shapes of the original invention. The planes also appear in the modifications made to the baffles of the side speakers.

The improvements include the following technical features:

(1) All of the transducers are shielded by cylindrical structures with elliptical end faces lying in planes oriented at ½ dihedral angle of the regular tetrahedron to the cylinder axis, namely, 35°, 16′ and where the long axis of the elliptical end faces are set at 45° to the horizontal.

(2) The planes of the elliptical end faces of the shielding cylinders correspond or are isomorphic to the tympanic membrane of the human hearing structure.

(3) The shielding cylinders of the optimal shadow omniphonic microphone component and of the isomorphic loud speaker module are isomorphic to the truncated cylinders described in the microphone and loud speaker components of U.S. Pat. No. 4,122,910 and indicated in that patent by reference character 23.

(4) The planes of the end faces of a center cylinder located between the shielding cylinders in the optimal shadow omniphonic microphone component correspond to the dihedral planes of the omniphonic microphone of the above U.S. Patent and illustrated in FIG. 8 thereof.

(5) The planes of end faces of a center cylinder located between the shielding cylinders in the isomorphic module of the loud speaker component correspond to the dihedral planes of the omniphonic loud speaker illustrated in FIG. 9 of the above U.S. Patent.

(6) The long axes of elliptical end faces of shielding cylinders attached to room loudspeaker baffles in the speaker system are set at 45° and incline downwardly to horizontal. The end faces away from the listener.

With the foregoing in view, and other advantages as will become apparent to those skilled in the art to which this invention relates as this specification proceeds, the invention is herein described by reference to the accompanying drawings forming a part hereof, which includes a description of the best mode known to the applicant and of the preferred typical embodiment of the principles of the present invention, in which:

DESCRIPTION OF THE DRAWINGS

In the drawings like characters of reference indicate corresponding parts in the different figures.

DETAILED DESCRIPTION

Proceeding to describe the invention in detail, reference should first be made to FIGS. 1 through 4 which which illustrate the Optimal shadow Omniphonic Microphone portion of the invention.

Figure 1:
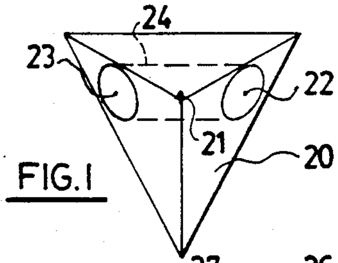
FIG. 1 shows schematically the geometry of the optimal shadow omniphonic microphone component of the present invention.

FIG. 1 shows partially schematic, a tetrahedron 20 with a geometry like that of the tetrahedron forming the microphone module illustrated and described in U.S. Pat. No. 4,122,910 and specifically FIG. 8 thereof.

Figure 8:
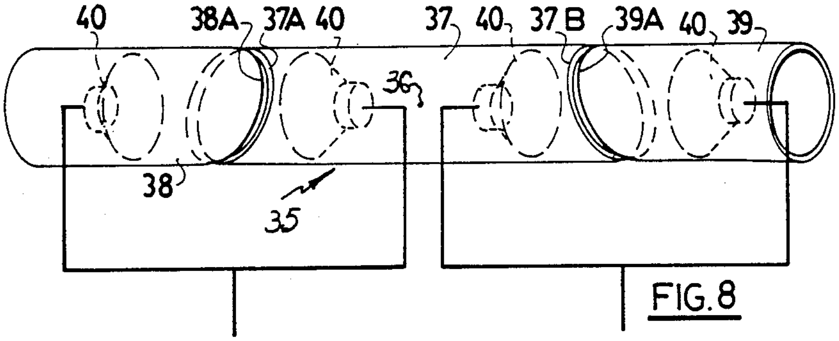
FIG. 8 is an enlarged front and right end isometric view of the isomorphic module of FIG. 7.
Figure 7:
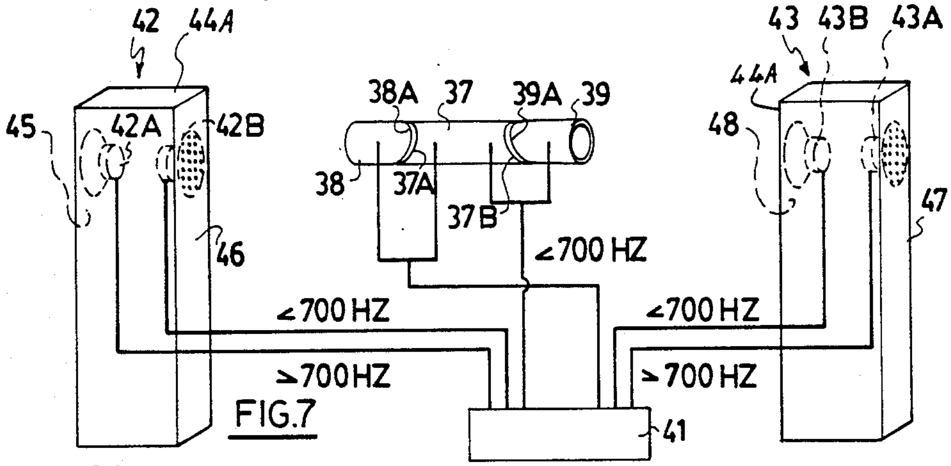
FIG. 7 is an isometric view of FIG. 6 with the electronic connections shown schematically.

Reference character 21 illustrates the centre of this tetrahedral structure and points 22 and 23 show the locations where the centres of microphones would be located in the tetrahedron according to FIG. 8 of U.S. Pat. No. 4,122,910.

Figure 4:
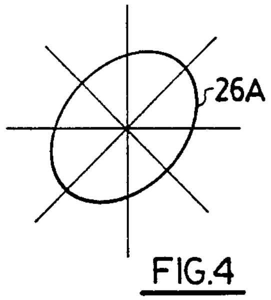
FIG. 4 is a schematic end elevation of one of the end faces of a cylinder carrying a microphone.

The cylindrical outline 24 shown in phantom in FIG. 1, illustrates a cylindrical core of the tetrahedron, which corresponds to the centre section of a microphone component constructed according to the present invention. Such a microphone component, collectively designated 25 is illustrated in FIGS. 2, 3 and 4 of the enclosed drawings.

Figure 2:
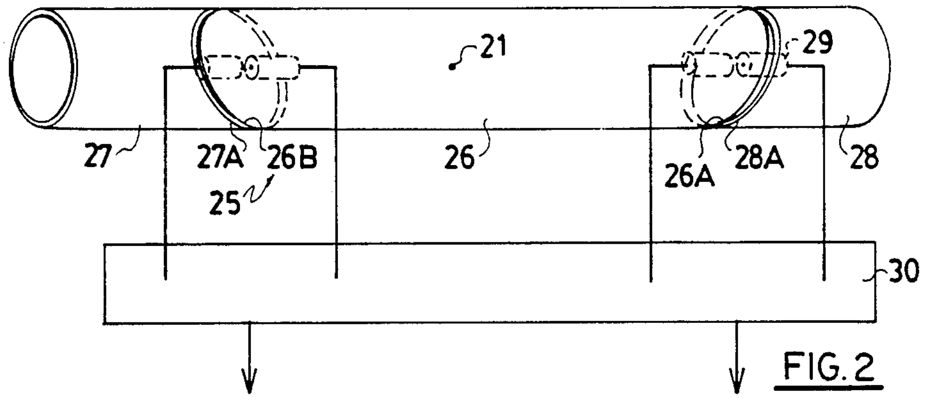
FIG. 2 is a rear and left hand isometric view of this microphone component with electronic connections being shown schematically.
Figure 3:
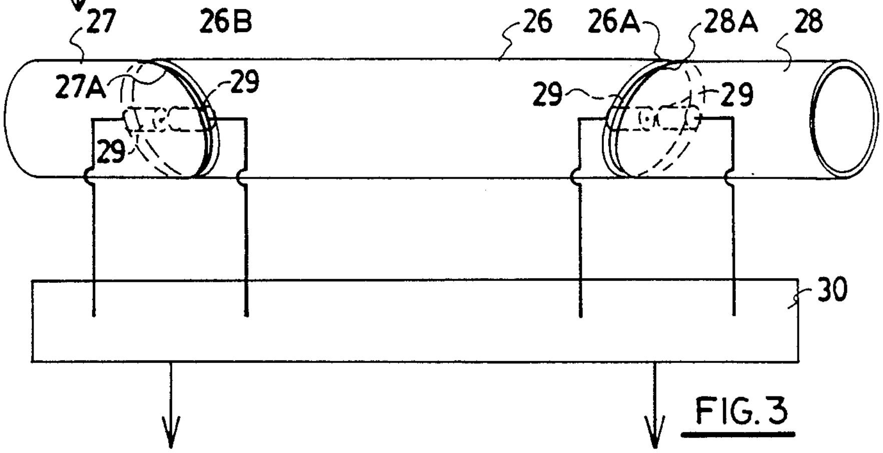
FIG. 3 is a front and right hand isometric view of FIG. 2.

This microphone component 25 consists of a central cylinder 26, a righthand shielding cylinder 27 and a lefthand shielding cylinder 28, it being understood that FIG. 2 is a rear view of the component whereas FIG. 3 is a front view.

The 21 of the cylindrical core 24 of the tetrahedron of FIG. 1 has a corresponding centre point in cylinder 26, as illustrated by reference character 21 of FIG. 2. The cylinders 26, 27 and 28 are formed from a solid material. The ends 26A and 26B of the central section are elliptical and lie in plans oriented at an angle of 35° 16′ to the axis x—x of the cylinder, which equals half the dihedral angle of the regular tetrahedron shown in FIG. 1.

The corresponding inner ends 27A and 28A of the end shielding cylinders 27 and 28 are also elliptical and lie in planes at a similar angle of 35° 16′ to the axis x—x the longitudinal axes of the elliptical end faces are oriented at 45° to a horizontal plane. This is illustrated by comparison of FIGS. 2 and 3 and shown schematically in FIG. 4.

Conventional microphone elements 29 open onto the end faces of all four ends 26A, 26B, 27A and 28A and are connected electrically to a conventional microphone mixer 30 and thence to left and right amplifiers all of which is conventional.

The confronting ends 26B/27A and 26A/28A are spaced apart from one another thus forming an adjustable gap therebetween which may be in the order of between 1–4 mm as an example and this gap is selected for optimum sound reception with minimal ambiguity.

Figure 9:
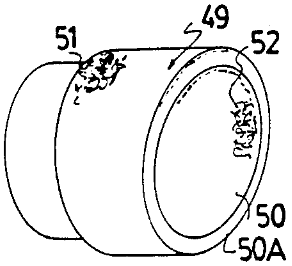
FIG. 9 is an enlarged isometric view of one of the shielding cylinders of the outer speaker components.
Figure 5:
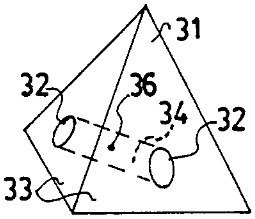
FIG. 5 is a view similar to FIG. 2 and illustrating, schematically, the geometry of a loud speaker module of the present invention.

FIGS. 5 through 12 show the isomorphic module and outer speaker modules constituting loudspeaker component of the system and reference should first be made to FIG. 5 which shows a regular tetrahedron 31 similar to the loudspeaker tetrahedron shown in FIG. 9 of U.S. Pat. No. 4,122,910.

In this U.S. patent, two transducers are situated on adjacent faces of the tetrahedron where the elipses 32 are shown on faces 33 in FIG. 5. Cylinder 34 shown in phantom in FIG. 5 of the present application to represents, the isomorphic module collectively designated 35 with reference character 36 indicating the theoretical centre of the tetrahedron and of the cylinder 35.

The construction shown in detail in FIG. 8, is similar to the module of the microphone component shown in FIG. 3 in that it contains a central section 37 and end sections 38 and 39. These are formed from hollow cylindrical material filled with acoustical insulation material (not illustrated). The outer ends 37A and 37B of the centre section 37 are also elliptical and lie in planes at an angle of 35° 16′ longitudinal axis y—y as are the inner ends 38A and 39A. Once again the long axes of the elliptical end faces are oriented at 45° to a horizontal plane as clearly shown by a consideration of FIG. 8 and comparing same with the structure shown in FIGS. 2 and 3.

Mid-range transducers 40 are mounted spaced inwardly from the ends 37A/38A and inwardly from the ends 37B and 39A and are connected electrically to the amplifier 41 as shown.

Once again the adjacent end faces of the sections 37, 38 and 39 are spaced apart and the gaps therebetween may be adjusted similar to that described for the microphone components.

Figure 6:
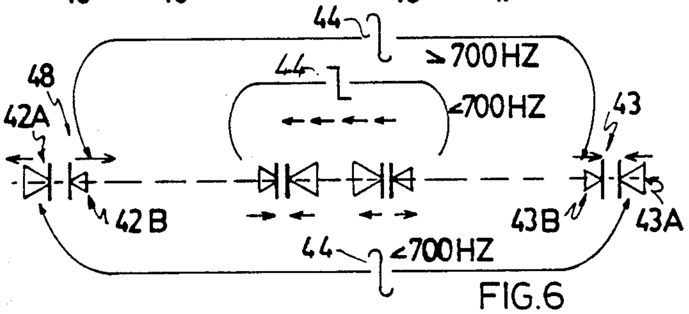
FIG. 6 is a schematic view of the relationship of the isomorphic module and the outer speaker modules.

FIG. 6 shows, schematically, the alignment of all of the transducers not only of the isomorphic module but also of outer or side speaker modules collectively designated 42 and 43 with the left and right channel connections controlled by amplitude controls 44 and connected to the amplifier as shown.

From this schematic view, it will be seen that the outer speakers 42A and 43A are low-range speakers connected to opposite channels and that the inner speakers 42B and 43B are high-range speakers connected to the opposite channels with the crossover being approximately 700 Hz. The four central speakers 40 are mid-range tweeter type speakers and are also connected to the respective channels as illustrated. The cross-over frequency need not be rigidly fixed but may be in a range between 700–1500 Hz.

Figure 10:
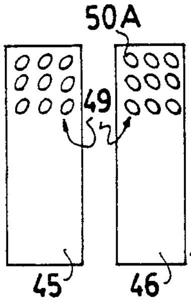
FIG. 10 is a partially schematic front elevation of the left and right baffles of the lefthand speaker module.
Figure 11:
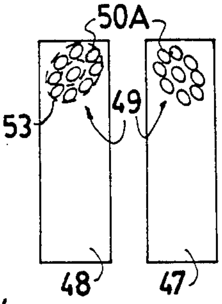
FIG. 11 is a view similar to FIG. 10 but showing the left and right baffles of the righthand speaker module.

The speaker modules 42 and 43 may be enclosed in an acoustic suspension or acoustic reflex speaker cabinet 44A of conventional construction with the exception of the speaker baffle panels shown in FIGS. 10 and 11. FIG. 10 shows the left outer baffle panel 45 of the component 42 and the left inner baffle panel 46 also of component 42.

FIG. 11 shows the right outer baffle panel 47 and the right inner baffle panel 48 both of the speaker component 43.

Figure 12:
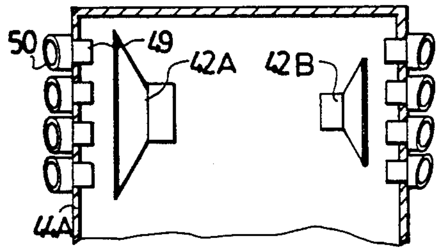
FIG. 12 is a fragmentary cross-sectional schematic view of part of one of the outer speaker cabinets showing the relationship between the shielding cylinders and the transducers.

All of the baffle panels include, adjacent the upper end thereof, a plurality of shielding cylinders collectively designated 49 adjacent the front of the cones of the speakers 42A and 42B and 43A and 43B respectively. Each of these shielding cyinders takes the form of a small cylindrical element having an elliptical outer end 50 oriented at 35° 16′to the axis z—z of the element. They are preferaly provided with a felt outer cover 51 and a felt inner liner 52 and they are mounted in the baffle panels in a symmetrical array as illustrated. Of importance is the fact that the shielding cylinders of the outer panels 45 and 47 are positioned so that their elliptical end faces open downwardly and outwardly from the panel whereas the elliptical end faces of the cylinder on the inner panels 46 and 48 open downwardly and inwardly from the panels as illustrated in FIGS. 10, 11 and 12.

All of the surfaces of the optimal shadow microphone/and the isomorphic module are preferably provided with a felt covering.

Since various modifications can be made in my invention as hereinabove described, and many apparently widely different embodiments of same made within the spirit and scope of the claims without departing from such spirit and scope, it is intended that all matter contained in the accompanying specification shall be interpreted as illustrative only and not in a limiting sense.

I claim:

1. An optimal shadow omniphonic microphone and loudspeaker system comprising in combination an omniphonic microphone component, a speaker component and electronic means coupling the microphone and speaker components for processing signals from the microphone component and transmitting signals to the speaker component said microphone component including a substantially cylindrical module with a longitudinal axis and comprising a centre section with two elliptical outer end faces and two end sections at opposite ends of the centre section in longitudinal alignment therewith, each end section having an elliptical inner end face confronting a respective one of the outer end faces of the centre section each said inner end face and the outer end face confronted thereby lying in substantially parallel, spaced planes oriented at an angle of approximately 35° 16′ to the axis of the module, the planes containing the outer end faces of the centre section being oriented at an angle of approximately 70° 32′ with respect to one another and each elliptical end face of the centre section and the end sections having a long axis oriented at approximately 45° to a horizontal plane, and a transducer situated centrally in each of said outer end faces of said centre section and said inner end faces of each of said end sections.

2. The system according to claim 1 in which each end section is spaced from the centre section thereby providing a gap between the inner end face of each end section and the outer end faces of said centre section confronted thereby, said gap having a width between 1 mm and 4 mm.

3. The system according to claim 1 in which said transducers take the form of microphones, and said electronic means comprise an amplifier.

4. The system according to claims 2 in which said transducers take the form of microphones, and said electronic means comprise an amplifier.

5. The system according to claim 1 in which said speaker component includes a substantially cylindrical module with a longitudinal axis and comprising a centre section with two outer end faces and two end sections at opposite ends of the centre section in longitudinal alignment therewith, each end section having an inner end face confronting a respective one of the outer end faces of the centre section, each of said inner and outer end faces being elliptical with each said inner end face and the out end face confronted thereby lying in substantially parallel, spaced planes oriented at an angle of approximately 35° 16′ to the axis of the module, the planes containing the outer end faces of the centre section being oriented at an angle of approximately 70° 16′ with respect to one another and each elliptical end face of the centre section and each end section being oriented at approximately 45° to a horizontal plane, and a speaker transducer situated within and spaced from each outer end of said centre section and facing outwardly therefrom and a further speaker transducer situated within and spaced from the inner ends of each of said outer sections.

6. The system according to claim 2 in which said speaker component includes a substantially cylindrical module with a longitudinal axis and comprising a centre section with two outer end faces and two end sections at opposite ends of the centre section in longitudinal alignment therewith, each end section having an inner end face confronting a respective one of the outer end faces of the centre section, each of said inner and outer end faces being elliptical with each said inner end face and the out end face confronted thereby lying in substantially parallel, spaced planes oriented at an angle of approximately 35° 16′ to the axis of the module, the planes containing the outer end faces of the centre section being oriented at an angle of approximately 70° 16′ with respect to one another and each elliptical and face of the centre section and each end section being oriented at approximately 45° to a horizontal plane, and a speaker transducer situated within and spaced from each outer end of said centre section and facing outwardly therefrom and a further speaker transducer situated within and spaced from the inner ends of each of said outer sections.

7. The system according to claim 5 which includes an outer or side speaker module on each side of said cylindrical module and being operatively connected thereto, each said outer or side speaker module including an enclosure a pair of transducers in said enclosure, arranged back to back and spaced inwardly from opposing walls of said enclosure, a plurality of apertures formed through said walls in front of said transducers and shielding means shielding each of said apertures.

8. The system according to claim 7 wherein the shielding means comprise a shielding cylinder secured around each of said apertures with an inner end of each shielding cylinder facing the adjacent one of said transducers, an outer end of each shielding cylinder being elliptical and lying in a plane oriented at an angle of approximately 35° 16′ to a longitudinal axis of the shielding cylinder, the long axis of the elliptical end being oriented at an angle of 45° to a horizontal plane.

9. The system according to claim 8 in which inner and outer surfaces of said shielding cylinders are covered with a sound absorbent material.

10. A system according to claim 2 including means for adjusting the gap between the inner end face of each end section and the outer end face of the centre section.

11. A microphone comprising a substantially cylindrical module with a longitudinal axis and comprising a centre section with two elliptical outer end faces and two end sections at opposite ends of the centre section in lingitudinal alignment therewith, each end section having an elliptical inner end face confronting a respective one of the outer faces of the centre section each said end face and the outer end face confronted thereby lying in substantially parallel spaced planes oriented at an angle of approximately 35° 16′ to the lingitudinal axis of the module, the planes containing the outer end faces of the centre section being oriented at an angle of approximately 70° 32′ with respect to one another and each elliptical end face of the centre section and the end sections having a long axis oriented at approximately 45° to a horizontal plane, and a microphone situated centrally in each of said outer end faces of said centre section and said inner end faces of each of said end sections.

12. A loudspeaker comprising in combination a substantially cylindrical module with a longitudinal axis and comprising a centre section with two elliptical outer end faces and two end sections at opposite ends of the centre section in longitudinal alignment therewith, each end section having an elliptical inner end face confronting a respective one of the outer end faces of the centre section each said inner end face and the outer end face confronted thereby lying in substantially parallel spaced planes oriented at an angle of approximately 35° 16′ to the axis of the module, the planes containing the outer end faces of the centre section being oriented at an angle of approximately 70° 32′ with respect to one another and each elliptical end face of the centre section and the end sections having a long axis oriented at approximately 45° to a horizontal plane, and a speaker transducer situated within and spaced from each outer end of said centre section and facing outwardly therefrom and a further speaker transducer situated within and spaced from the inner ends of each of said outer sections.

13. A speaker comprising an enclosure, a pair of transducers inserted in the enclosure, arranged back to back spaced inwardly from respective ones of two opposing walls of the enclosure, a plurality of apertures formed through each of said opposing walls in front of the respective transducer and a shielding cylinder projecting through each of said apertures with an outer end face of each shielding cylinder being elliptical and lying in a plane oriented at an angle of approximately 35° 16′ to a longitudinal axis of the cylinder, the long axis of the elliptical end face of each shielding cylinder being oriented at an angle of 45° to a horizontal plane.

14. A speaker according to claim 13 wherein each shielding cylinder has inner and outer surfaces thereof covered with a sound absorbing material.

* * * * *